United States Patent
Park et al.

(10) Patent No.: US 8,489,963 B2
(45) Date of Patent: *Jul. 16, 2013

(54) DEVICE FOR PROCESSING STREAMS AND METHOD THEREOF

(75) Inventors: Chan-sub Park, Incheon (KR); Hae-joo Jeong, Seoul (KR); June-hee Lee, Seongnam-si (KR); Joon-soo Kim, Seoul (KR); Jung-pil Yu, Suwon-si (KR); Eui-jun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 365 days.

This patent is subject to a terminal disclaimer.

(21) Appl. No.: 12/764,672

(22) Filed: Apr. 21, 2010

(65) Prior Publication Data

US 2010/0199147 A1 Aug. 5, 2010

Related U.S. Application Data

(63) Continuation of application No. 12/670,775, filed as application No. PCT/KR2008/004374 on Jul. 25, 2008.

(60) Provisional application No. 60/952,109, filed on Jul. 26, 2007.

(30) Foreign Application Priority Data

Dec. 11, 2007 (KR) .................. 10-2007-0128263

(51) Int. Cl.
 *H03M 13/00* (2006.01)

(52) U.S. Cl.
 USPC ............ 714/758; 714/763; 714/764; 370/503

(58) Field of Classification Search
 USPC ........................... 714/758, 763, 764; 370/503
 See application file for complete search history.

(56) References Cited

U.S. PATENT DOCUMENTS

| 5,793,779 | A | * | 8/1998 | Yonemitsu et al. | 714/764 |
|---|---|---|---|---|---|
| 6,112,324 | A | * | 8/2000 | Howe et al. | 714/763 |
| 2006/0280081 | A1 | * | 12/2006 | Iida et al. | 369/47.54 |
| 2007/0098021 | A1 | * | 5/2007 | Brennan | 370/503 |
| 2008/0175236 | A1 | * | 7/2008 | Lee et al. | 370/389 |
| 2010/0185920 | A1 | * | 7/2010 | Song et al. | 714/758 |

FOREIGN PATENT DOCUMENTS

| EP | 0 681 373 B1 | 2/2003 |
|---|---|---|
| KR | 10-2002-0029429 A | 4/2002 |
| KR | 10-2004-0031179 A | 4/2004 |
| WO | 2006/085251 A2 | 8/2006 |

OTHER PUBLICATIONS

Venkatramani, "A survey of near-line storage technologies: Devices and Systems", Oct. 1993, SUNY, pp. 1-36.*

* cited by examiner

*Primary Examiner* — Joshua P Lottich
*Assistant Examiner* — Jeison C Arcos
(74) *Attorney, Agent, or Firm* — Sughrue Mion, PLLC

(57) ABSTRACT

A device for processing streams is disclosed. The device includes a stream arranging unit which stacks and rearranges a stream, and a dummy inserting unit which inserts a dummy into the rearranged stream. The device may further include a convolutional interleaver which interleaves the stream with a dummy or an RS encoder and a CRC encoder.

6 Claims, 6 Drawing Sheets

DEVICE FOR PROCESSING STREAMS AND METHOD THEREOF

CROSS-REFERENCE TO RELATED PATENT APPLICATION

This application is a continuation of U.S. patent application Ser. No. 12/670,775 filed on Jan. 26, 2010, which claims priority from PCT/KR2008/004374 filed on Jul. 25, 2008, which claims priority from U.S. Provisional Application No. 60/952,109 filed Jul. 26, 2007, and Korean Patent Application No. 10-2007-0128263 filed Dec. 11, 2007, all of which are incorporated herein in their entireties by reference.

BACKGROUND

1. Field

Apparatuses and methods consistent with the present inventive concept relate to processing streams by interleaving the streams with a dummy.

2. The Related Art

With the development of electronic and communication technologies, digital technologies have been introduced into the field of broadcasting systems, and diverse standards for digital broadcasting have been published. Specifically, these standards include the Advanced Television Systems Committee (ATSC) Vestigial Sideband (VSB) standard that is used as a digital terrestrial broadcasting standard in North America, and the Digital Video Broadcasting-Terrestrial (DVB-T) standard that is used as a digital terrestrial broadcasting standard in Europe.

The ATSC VSB transmission method used in North America is based on the National Television System Committee (NTSC) frequency band, and is advantageous in that a transmitter and a receiver can be implemented easily and economically. Such an ATSC VSB transmission method uses a single carrier amplitude modulation vestigial side band (VSB), and is able to transmit high quality video, audio, and auxiliary data at a single 6 MHz bandwidth.

Diverse standards for digital broadcasting have been proposed so as to provide improved digital broadcasting services.

Accordingly, there is a need for technologies for more effectively and stably processing streams.

SUMMARY

The present inventive concept addresses the above problem. According to aspects of the present inventive concept, there is provided a device for processing streams capable of processing streams efficiently and stably, a method thereof, and a digital broadcasting receiver receiving the processed streams.

According to one exemplary embodiment, there is provided a device for processing streams, the device comprising: a stream rearranging unit which stacks and rearranges a stream; and a dummy inserting unit which inserts a dummy into the rearranged stream.

The interleaver may be a convolutional interleaver.

The stream rearranging unit may vertically stack the stream according to a number of packets that are preset for each unit and rearrange the stream by perpendicularly rotating the stacked stream for each unit.

The stream rearranging unit may divide respective packets for each unit into blocks having a preset size and perform the perpendicular rotation on the respective packets in each block.

The dummy inserting unit may insert a dummy corresponding to a size of a memory in the interleaver into the stream rotated in each block.

The device for processing streams may further comprise a dummy removing unit which removes the dummy from the stream output from the interleaver; and a burst generating unit which collects the stream, from which the dummy is removed, in burst units.

According to another exemplary embodiment, the stream rearranging unit may rearrange the stream so as to be horizontally arranged according to a preset first size unit, and vertically stacking the stream.

The device for processing streams may further comprise a Reed-Solomon (RS) encoder which adds an RS parity vertically to an end portion of the stream; and a Cyclic Redundancy Check (CRC) encoder which adds a CRC value horizontally to an end portion of the stream to which the RS parity is added.

The dummy inserting unit may divide the stacked stream into transmission bursts, each burst having a preset second size, and add a dummy into the stream.

The dummy may be inserted into only a burst of the transmission bursts which does not satisfy the preset second size.

According to an exemplary embodiment, there is provided a method of processing streams, the method comprising stacking and rearranging a stream, and inserting a dummy into the rearranged stream.

The interleaving the stream may comprise using a convolutional interleaver.

The stacking and rearranging the stream may comprise vertically stacking the stream according to a number of packets that are preset for each unit; and rearranging the stream by perpendicularly rotating the stacked stream for each unit.

The rearranging the stream by perpendicularly rotating the stacked packets for each unit may comprise dividing respective packets for each unit into blocks having a preset size and performing the perpendicular rotation on the respective packets in each block.

The inserting the dummy may comprise inserting a dummy corresponding to a size of a memory of the convolutional interleaver into the stream rotated in each block.

The method of processing streams may further comprise removing the dummy from the interleaved stream; and collecting the stream, from which the dummy has been removed, in burst units.

According to another exemplary embodiment, the rearranging the stream may comprise horizontally arranging the stream according to a preset first size unit and vertically stacking and rearranging the stream.

The method of processing streams may further comprise performing RS encoding which adds an RS parity vertically to an end portion of the stream; and performing CRC encoding which adds a CRC value horizontally to an end portion of the stream to which the RS parity is added.

The inserting the dummy may comprise dividing the stacked stream into transmission bursts, each burst having a preset second size; and adding a dummy into the stream.

The dummy may be inserted into only a burst of the transmission bursts which does not satisfy the preset second size.

According to an exemplary embodiment of the present invention, there is provided a digital broadcasting receiver comprising a tuner which receives a stream; a demodulator which demodulates the received stream; an equalizer which equalizes the demodulated stream; and a deinterleaver which deinterleaves the equalized stream, wherein the stream is stacked and rearranged in a preset unit, and is processed by inserting a dummy, at a digital broadcasting transmitter which transmits the stream.

The stream may be convolutionally interleaved and the dummy is removed therefrom, at the digital broadcasting transmitter.

The digital broadcasting receiver may further comprise a dummy removing unit which removes the dummy inserted into the stream, wherein the stream is block-interleaved and the dummy is inserted thereinto, at the digital broadcasting transmitter.

With a device for processing streams, a method thereof, and a digital broadcasting receiver according to the diverse forms of exemplary embodiments, streams can be transmitted/received efficiently and stably.

DETAILED DESCRIPTION OF EXEMPLARY EMBODIMENTS

Hereinafter, exemplary embodiments will be described with reference to the accompanying drawings.

Figure 1:
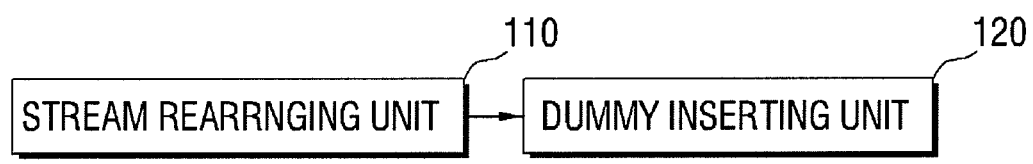
FIG. 1 is a block diagram showing a configuration of a device of processing streams according to an exemplary embodiment.

FIG. 1 is a block diagram showing a configuration of a device of processing streams according to an exemplary embodiment. Referring to FIG. 1, the device of processing streams includes a stream rearranging unit 110 and a dummy inserting unit 120.

The stream rearranging unit 110 stacks and rearranges an input stream. Rearrangement methods may vary according to various exemplary embodiment.

The dummy inserting unit 120 inserts a dummy into the stream rearranged by the stream rearranging unit 110. The dummy means data which are inserted to have the rearranged streams be distinguished by a preset processing unit or transmission unit. The dummy may use optional data with no meaning, for example, a preset bit value such as 0 bits, or a preset byte value. The dummy may also use meaningful data. For example, when there are diverse forms of data to be transmitted supplementarily, for example, data such as supplementary reference signals or supplementary channel information, corresponding data may be used as a dummy.

The stream rearranging unit 110 may stack the stream in a preset unit. For example, the stream rearranging unit 110 may horizontally arrange a part of the stream in packet or segment and then arrange another part of the stream in the next packet or segment on the following line of the stream to vertically stack the stream.

An interleaving unit may be added to a rear end of the dummy inserting unit 120 of FIG. 1.

Figure 2:
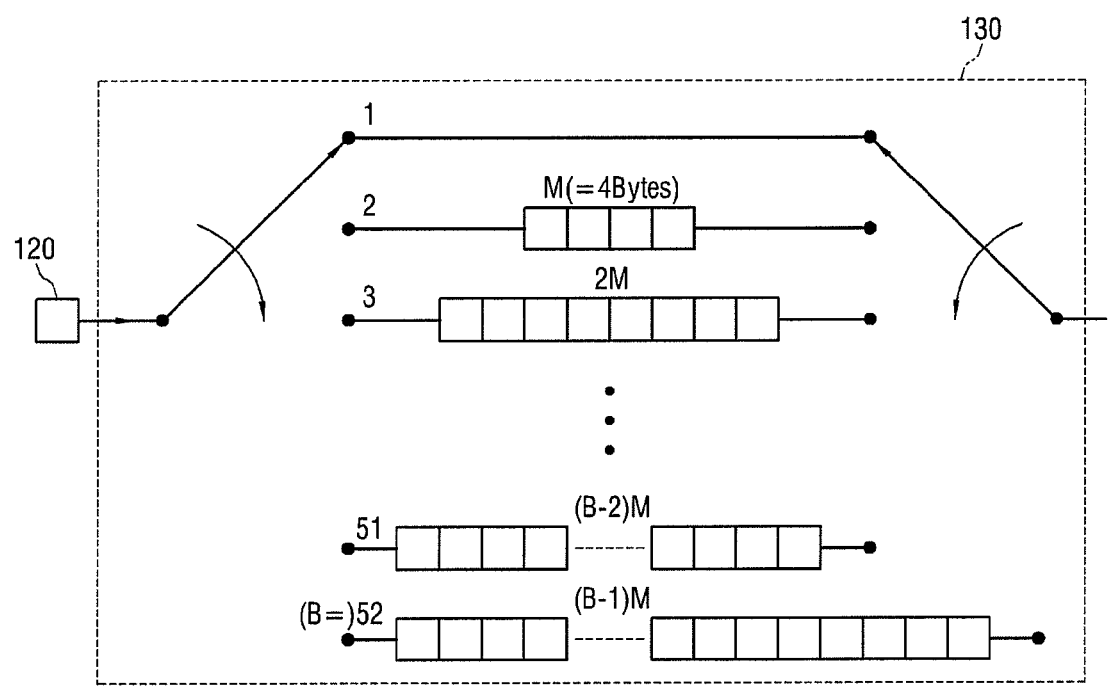
FIG. 2 is a schematic block diagram showing the device of processing streams of FIG. 1 to which a convolutional interleaver is added, according to an exemplary embodiment.

FIG. 2 is a schematic block diagram showing the device of processing streams of FIG. 1 to which an interleaving unit 130 is added.

As shown in FIG. 2, the interleaving unit 130 is implemented as a convolutional interleaver, and may be provided on a rear end of the dummy inserting unit 120. More specifically, the interleaving unit 130 may be implemented as a convolutional byte interleaver that processes the stream in bytes. The interleaving unit 130 of FIG. 2 may be implemented to have different branch numbers and memory sizes according to the sort of transceiver used.

When the interleaving unit 130 is implemented as a convolutional byte interleaver, the interleaving unit 130 includes a plurality of shift registers having different lengths. In other words, shift registers having sizes M, 2M . . . (B−2)M, (B−I)M are arranged in sequence. The interleaving unit 130 selects the respective shift registers in sequence to make the interleaving intervals different.

Referring to FIG. 2, the stream input to the interleaving unit 130 are divided into bytes and stored in the plurality of shift registers in sequence, and are then output again in sequence. Interleaving in bytes is performed in this manner.

For example, when the input stream is divided into a plurality of fields, each of which comprises 312 data segments or packets, the interleaving unit 130 may be implemented to operate using blocks of 52 data segments or packets.

FIGS. 3 to 6 are schematic block diagrams explaining a stream processing operation of the device of processing streams as shown in FIGS. 1 and 2 when a convolutional interleaver is used as the interleaving unit 130.

Figure 3:
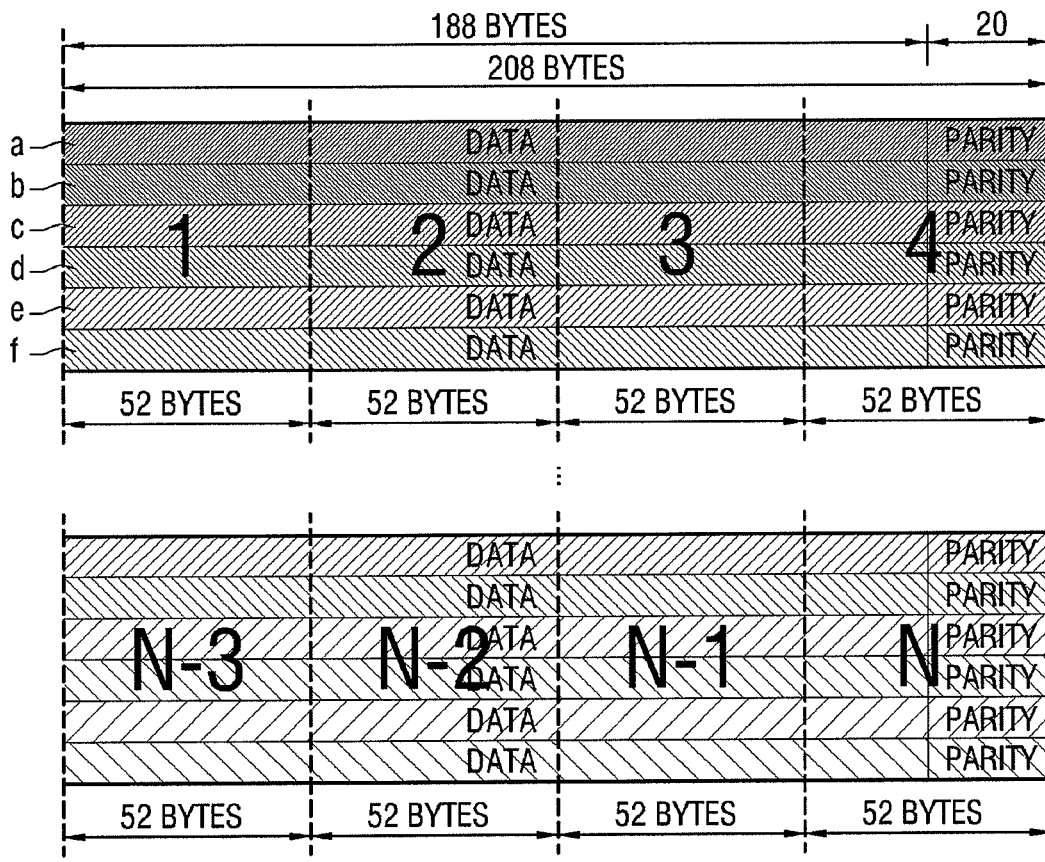
FIGS. 3 to 6 are schematic block diagrams explaining stream processing operation of a device of processing streams using a convolutional interleaver, according to exemplary embodiments.

Referring to FIG. 3, a stream rearranging unit 110 stacks a stream sequentially in blocks of preset numbers of packets. For example, the stream rearranging unit 110 may stack the stream in blocks, each block having six packets. Each packet may have a form including 188 bytes of data and a 20-byte parity. The stream rearranging unit 110 may rotate perpendicularly and rearrange the respective vertically stacked stream units.

In this case, as shown in FIG. 3, the stream rearranging unit 110 may divide horizontally the plurality of stacked packets into a plurality of blocks again. In this case, six packets may be divided into four blocks. When a single packet consists of a total of 208 bytes as shown in FIG. 3, the stream arranging unit 110 may divide each stack of 6 packets into four blocks, each packet of each block having 52 bytes. As shown in FIG. 3, the plurality of packets may thus be divided into N blocks. For convenience of explanation, the blocks divided by the stream rearranging unit 110 are represented as 1, 2, 3, 4 . . . N−3, N−2, N−I and N.

Figure 4:
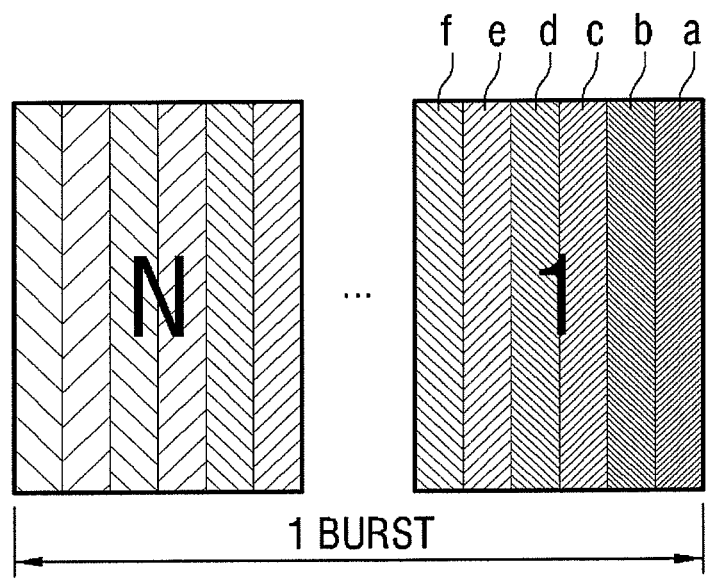

FIG. 4 shows a state of rotated blocks, after a stream has been divided into blocks by a stream rearranging unit 110. The stream rearranging unit 110 may rotate each of N blocks by 90 degrees in a clockwise direction. Six packets a, b, c, d, e and f are thereby arranged vertically as shown in FIG. 4. The stream rearranging unit 110 may output the rotated blocks sequentially as shown in FIG. 4.

FIG. 4 shows that N blocks rotated by the stream rearranging unit 110 are output sequentially from a first block to an N-th block, but the N blocks may be output randomly, not sequentially. When N blocks are output randomly by the stream rearranging unit 110, it may be expected that data are much more mixed after being interleaved by the interleaving unit 130.

Figure 5:
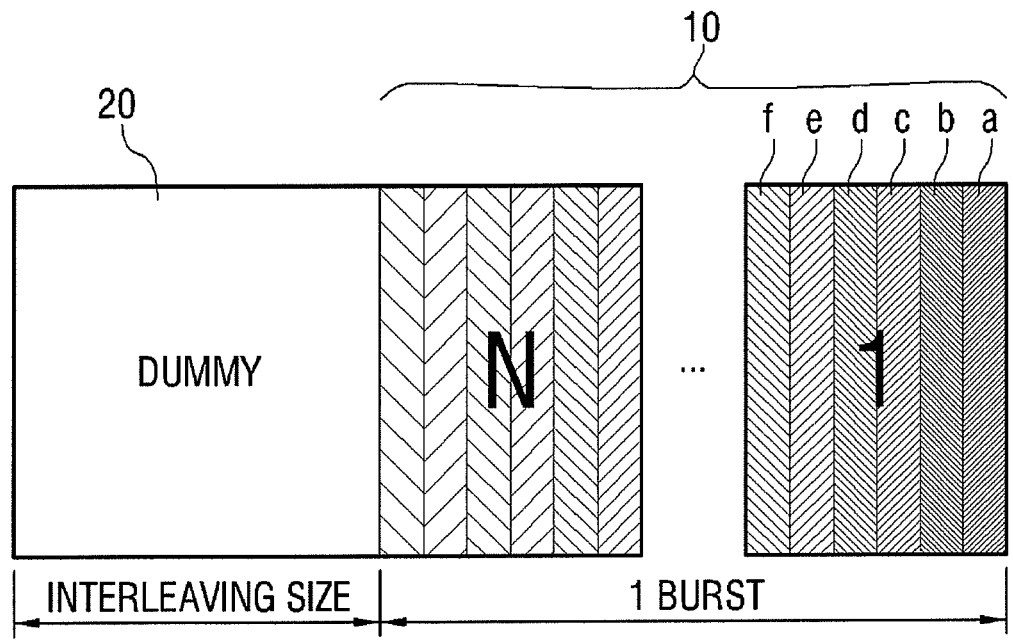

FIG. 5 is a schematic block diagram of a stream into which dummy 20 is inserted by a dummy inserting unit 120. Referring to FIG. 5, the dummy inserting unit 120 may insert the dummy 20 into the data part 10. In this case, the dummy inserting unit 120 may insert the dummy 20 of an appropriate size into the data part 10 taking into consideration the memory size of the interleaving unit 130, that is, the interleaving size.

In other words, since the interleaving unit 130 includes a plurality of shift memories, the dummy 20 corresponding to the plurality of shift memories should be inserted in order that the data part 10 is stored in the shift memories to be output. As the dummy 20 is thus input to the interleaving unit 130, the data part 10 is shifted normally and output.

Figure 6:
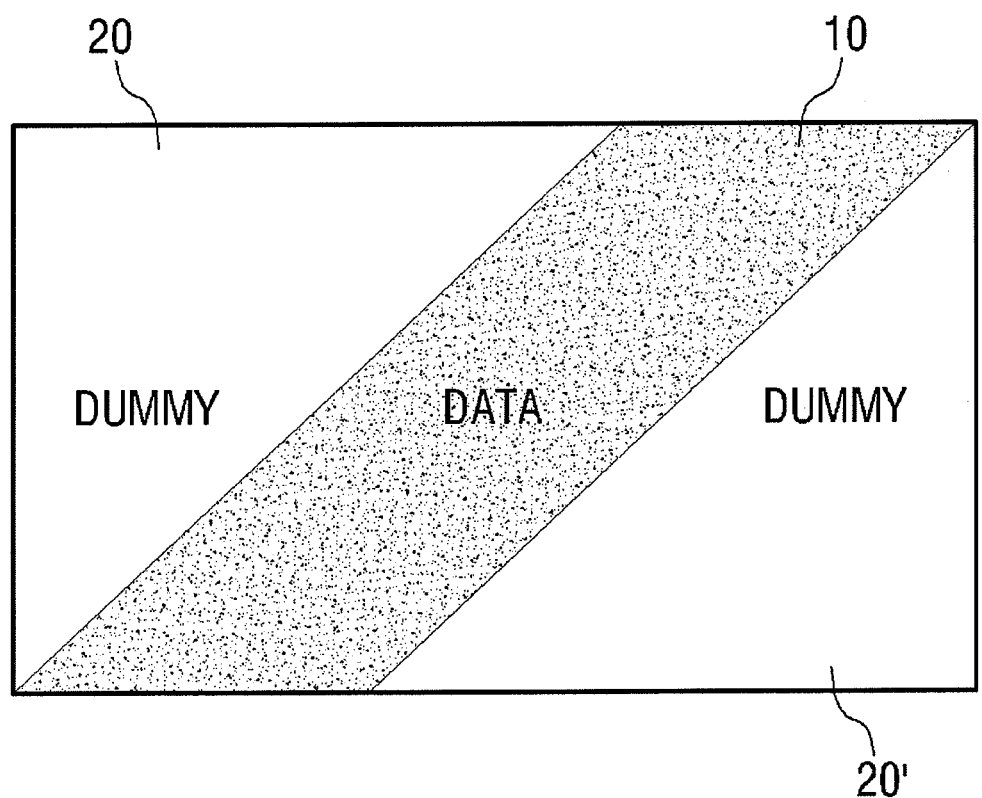

FIG. 6 is a schematic block diagram of a stream after being interleaved by the interleaving unit 130. Data are mixed by the interleaving operation of the interleaving unit 130. In this case, the dummy 20 of FIG. 5 is output after the data part 10 is output, so the dummy 20 is positioned to the left of a data part 10 in FIG. 6. A dummy 20' positioned to the right of the data part 10 may become a dummy for previous data.

As described above, the interleaving is performed after the stream is rearranged by the stream rearranging unit 110, and it is possible to secure sufficiently wide interleaving intervals. In other words, when a convolutional interleaver of FIG. 2 is used, an interleaving interval between the same data is only 4 bytes or 8 bytes if a memory path such as M or 2M is selected. The interleaving performance is thus deteriorated.

However, as shown in FIGS. 3 to 5, if the stream is rearranged and interleaved after adding the dummy 20 in the stream rearranging unit 110, it is possible to secure sufficiently wide interleaving intervals between the same data. The interleaving performance can thereby be improved.

Meanwhile, after the stream including the dummy 20 is interleaved as shown in FIG. 6, the dummy may be removed from the stream for transmission.

Figure 7:
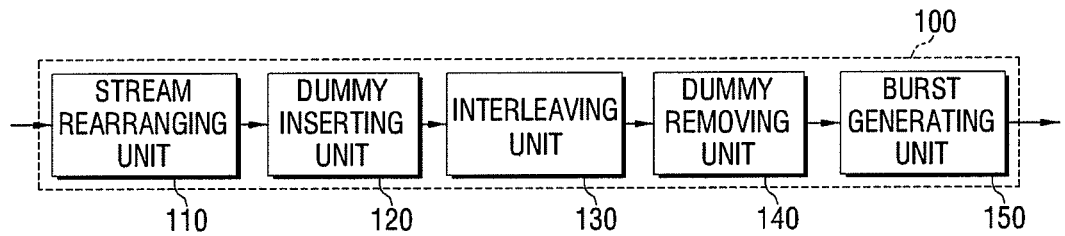
FIG. 7 is a block diagram showing one example of a detailed configuration of the device of processing streams of FIG. 1.

FIG. 7 is a block diagram showing an example of a device for processing streams 100 including the interleaving unit 130 as shown in FIG. 2, further including a dummy removing unit 140 and a burst generating unit 150.

Referring to FIG. 7, the interleaving unit 130 of the device for processing streams 100 may output the stream of FIG. 6 to the dummy removing unit 140.

The dummy removing unit 140 removes the dummy 20 from the stream, and the burst generating unit 150 collects, in a burst unit, the stream from which the dummy 20 has been removed by the dummy removing unit 140. Assuming that a unit of the stream input into the device for processing streams 100 is referred to as one burst, the burst generating unit 150 may collect the stream corresponding to one burst and output the stream in a state that the dummy 20 has been added to the stream for processing by the interleaving unit 130 and then removed therefrom.

Figure 8:
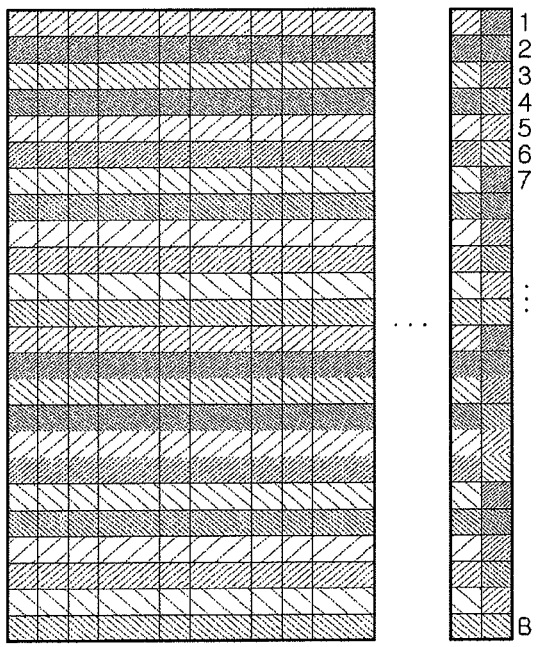
FIG. 8 is a schematic block diagram showing one example of a configuration of streams from which the dummy has been removed.

FIG. 8 is a schematic block diagram of a stream that is collected in a burst unit, after the stream has been interleaved by the interleaving unit 130 and the dummy 20 has been removed therefrom by the dummy removing unit 140.

In other words, the stream of FIG. 8 may be a final state of the stream output by the device for processing streams 100. Referring to FIG. 8, the stream has a vertical length corresponding to the branch number B of a convolutional interleaver such as the interleaving unit 130.

In this case, referring to the right-most vertical line of FIG. 8, it may be known that respective packets a, b, c, d, e, f . . . are interleaved and arranged in predetermined units. For example, "a" packet is interleaved in the manner that it is divided one by one into every six section. If the stream is rearranged, and then interleaved after adding the dummy 20 as described above, it is possible to prevent the interleaving intervals of the stream from being narrow in the related art interleaving method. Consequently, a stable stream transmission can be made, the possibility of packets being discarded and retransmitted is reduced, making it possible to provide an efficient digital broadcasting service.

Figure 9:
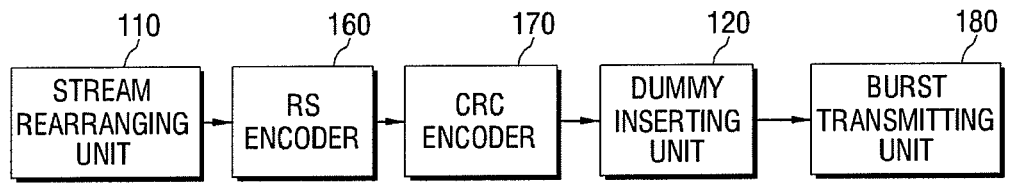
FIG. 9 is a block diagram showing a configuration of a device of processing streams according to another exemplary embodiment.

FIG. 9 is a schematic block diagram of a configuration of a device for processing streams according to another exemplary embodiment. Referring to FIG. 9, the device for processing streams further comprises an RS encoder 160, a cyclic redundancy check (CRC) encoder 170 and a burst transmitting unit 180, in addition to the stream rearranging unit 110 and the dummy inserting unit 120 as shown in FIG. 7.

The stream rearranging unit 110 rearranges a stream by arranging the stream horizontally according to a preset first size unit and stacking the stream vertically. The form of the rearranged stream is shown in FIG. 10.

Figure 10:
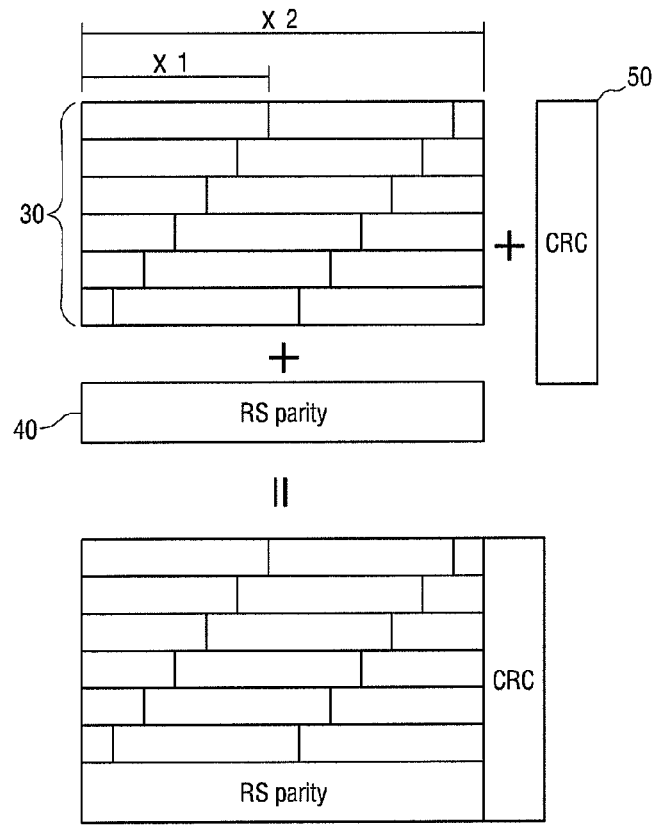
FIGS. 10 and 11 are schematic block diagrams explaining the stream processing operation of a device of processing streams of FIG. 9, according to exemplary embodiments.

Referring to FIG. 10, a stream 30 is arranged horizontally according to a first size x2, and is stacked vertically to form a plurality of lines, according to an exemplary embodiment. In this exemplary embodiment, the stream may be divided into a plurality of sections, and more than one section may be arranged in a row on one line having the first size x2. If, however, the more than one section exceeds the first size x2, a later portion of the last section may be arranged on a subsequent line. Specifically, a plurality of sections of the stream, each section having a second size x1, may be disposed within one line, x1 may be diversely set according to the exemplary embodiment. For example, x1 may be set as 187 bytes.

When the stream 30 is rearranged as shown in FIG. 10, the RS encoder 160 adds an RS parity 40 to an end portion of the stream 30 in a vertical direction. In other words, the RS encoder 160 calculates the RS parity 40 vertically with respect to the stream 30 and adds the calculated RS parity 40 into the stream 30 vertically.

The CRC encoder 170 adds CRC values 50 to the stream 30 to which the RS parity 40 is added in a horizontal direction. The CRC values 50 include both CRC values for the stream 30 and CRC values for the RS parity 40.

Consequently, the stream processed by the RS encoder 160 and the CRC encoder 170 may have the form shown at the bottom of FIG. 10.

The stream constituted as described above is transmitted using a method shown in FIG. 11, according to an exemplary embodiment.

Figure 11:
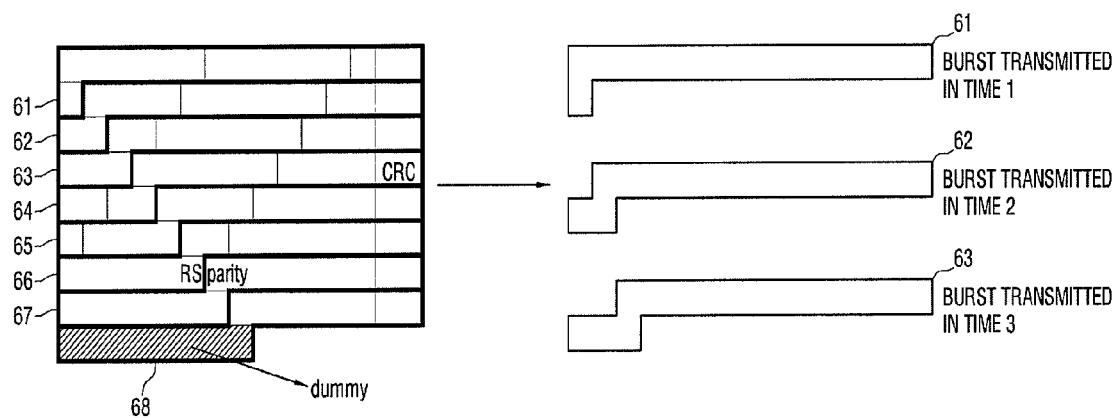

FIG. 11 is a schematic block diagram explaining a method of processing a stream. Referring to FIG. 11, the burst transmitting unit 180 as shown FIG. 9 transmits a stream supplied from the dummy inserting unit 120 in burst units 61, 62, 63, 64, 65, 66, 67 and 68. Here, the size of a single burst may be set to be larger than the horizontal size of the stream further including the CRC value 50 part. In this case, a single burst of the stream transmitted at a given time includes a portion of the stream disposed on a subsequent line.

In other words, as shown in the right side of FIG. 11, transmission is made in bursts. In the case of the last transmission burst 68 of FIG. 11, the burst 68 fails to completely make up the size of a single burst.

The dummy inserting unit 120 inserts a dummy into the stream so that an empty space within the burst can be filled thereby. In other words, the dummy inserting unit 120 divides the stream into transmission bursts of a preset second size, and, if a burst does not satisfy the preset second size of a single transmission burst, the dummy inserting unit 120 adds the dummy to the stream so as to match a single transmission burst size. Data transmission can thereby be performed in bursts by the burst transmitting unit 180.

As shown in FIGS. 10 and 11, transmission is performed horizontally in a state that the RS parity 40 is calculated vertically and added to the stream, so block interleaving is performed. In other words, the stream rearranged with the RS parity 40 and CRC values 50 added are stored in the plurality of memories in the form shown at the bottom of FIG. 10, and is then output in bursts horizontally as shown in FIG. 11, making it possible to obtain the effect of block interleaving.

As described above, the device for processing streams may be implemented using diverse methods.

The devices for processing streams having the diverse configurations described above may be used for a digital broadcasting transmitter. A stream processed by the above described devices may be an existing normal data stream, a supplementary data stream having enhanced robustness, or a stream including known data for improving equalization performance.

In this case, the device for processing streams may further comprise diverse constituents such as a MUX unit constituting a stream, a data processing unit allowing a supplementary data stream to have enhanced robustness, a randomizer performing randomization, an RS encoder performing RS encoding, a trellis encoder, a sync multiplexer adding a field sync or a segment sync to the stream, a modulator performing modulation, a known data inserting unit inserting known data to the stream, and the like. These constituents are disposed in diverse forms, so diverse exemplary embodiments may be constructed.

Figure 12:
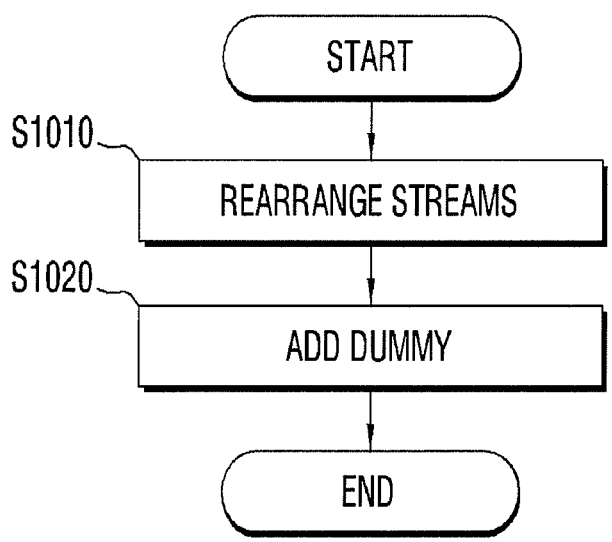
FIG. 12 is a flowchart explaining a method of processing streams according to an exemplary embodiment.

FIG. 12 is a flowchart explaining a method of processing streams according to an exemplary embodiment. Referring to FIG. 12, if a stream is input, the stream is rearranged in operation S1010. The rearranged forms are changed according to the configuration of an interleaver such as the interleaving unit 130 as shown in FIG. 2 or FIG. 7. In other words, when the interleaving unit 130 is a convolutional interleaver, the stream is stacked and then divided into blocks of a predetermined size, so the stream may be arranged by rotating the blocks perpendicularly.

When the device for processing streams is constructed as shown in FIG. 9 and block interleaving is thus performed, the dummy may be added only to some bursts.

The stacked and rearranged stream may be output such that the blocks constituting the stream are output sequentially or randomly.

The dummy is then added to the output stream in operation S 1020.

As described above, the dummy fills internal memories of the interleaving unit 130 with specific values so that interleaving is normally performed by the interleaving unit 130 to output the streams.

When the stream is rearranged and the dummy is inserted thereinto as shown in FIGS. 3 to 5, convolutional interleaving may be performed after adding the dummy. Owing to the interleaving, the respective packets within the stream are rearranged at diverse intervals. In this case, an operation to remove the dummy may be further included after interleaving the stream. After removing the dummy, an operation to collect and output the stream in burst units may also further be included. These operations have been explained in detail in the above description, so duplicated explanation thereof will be omitted.

When the device for processing streams is implemented in the form of FIG. 9, a separate interleaving operation may not be necessary after adding the dummy. In other words, in the case of the device for processing streams of FIG. 9, a stream is stacked and rearranged, and RS encoding and CRC encoding are performed thereon. In this state, an output is made horizontally to generate block interleaving. When a burst is not completely filled with data, RS parity, and CRC values during the process, the burst is filled with a dummy.

Figure 13:
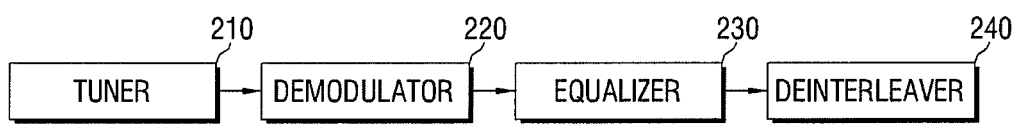
FIGS. 13 and 14 are block diagrams showing a configuration of a digital broadcasting receiver according to diverse exemplary embodiments.

FIG. 13 is a block diagram showing a configuration of a digital broadcasting receiver according to an exemplary embodiment. The digital broadcasting receiver of FIG. 13 may receive streams processed by the device for processing streams having a configuration as shown in FIG. 1, 7 or 9 or a digital broadcasting transmitter having the same. More specifically, the digital broadcasting receiver may be implemented as a portable display device such as a cellular phone, a laptop computer, a navigation device or an electronic notebook, or a display device such as a TV or a set-top box.

Referring to FIG. 13, the digital broadcasting receiver includes a tuner 210, a demodulator 220, an equalizer 230, and a deinterleaver 240.

The tuner 210 selects a channel and receives a stream.

The demodulator 220 demodulates the stream received by the tuner 210, and the equalizer 230 equalizes the demodulated stream.

The deinterleaver 240 deinterleaves the equalized stream to reconstitute the stream to its original state.

The stream received by the digital broadcasting receiver of FIG. 13 may be a stream that is convolutionally interleaved on the side of a transmitting terminal and from which a dummy is then removed. In other words, a stream in the shape as shown in FIG. 8 may be received and processed.

In the case of the stream processed in the manner shown in FIGS. 10 and 11, the stream may be a stream from which a dummy has not been removed. When the stream from which the dummy has not been removed is received, the digital broadcasting receiver may further include a configuration for removing the dummy.

Figure 14:
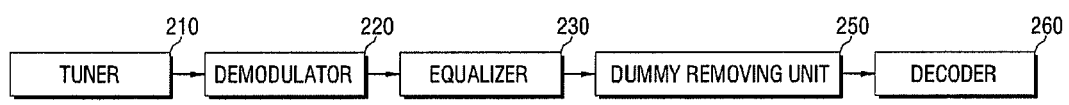

FIG. 14 is a block diagram showing a configuration of a digital broadcasting receiver receiving a stream including a dummy according to another exemplary embodiment. The digital broadcasting receiver of FIG. 14 includes a tuner 210, a demodulator 220, an equalizer 230, a dummy removing unit 250, and a decoder 260.

The dummy removing unit 250 removes a dummy from a stream processed as shown in FIGS. 10 and 11 and thus transmitted without the dummy being removed. In other words, the digital broadcasting receiver of FIG. 14 receives and processes the stream block-interleaved on the side of the digital broadcasting transmitter and including the dummy.

In this case, the dummy removing unit 250 checks the size of the data region of the stream using information included in the stream or information provided through a separate channel, so a part exceeding the size of the data region may be understood to be a dummy.

The decoder 260 decodes the stream from which the dummy has been removed and restores the stream. In this case, the decoder 260 stacks the streams sequentially and then processes them perpendicularly to the direction of stacking, thereby making it possible to obtain the block interleaving effects.

Although not shown in the digital broadcasting receiver in FIG. 13 or FIG. 14, the digital broadcasting receiver may further include diverse constituents, such as a trellis encoder, an RS decoder, a derandomizer, a demultiplexer, and the like.

The stream received by the digital broadcasting receiver of FIG. 13 or FIG. 14 may include a normal data stream, a supplementary data stream processed to have enhanced robustness, known data, or the like.

Although a few exemplary embodiments have been shown and described, it would be appreciated by those skilled in the art that changes may be made without departing from the principles and spirit of the present inventive concept, the scope of which is defined in the claims and their equivalents.

What is claimed is:

1. A digital broadcast receiving apparatus, comprising:
a tuner which receives a stream to which a Reed-Solomon (RS) parity and a Cyclic Redundancy Check (CRC) value are added to be perpendicular to each other, and then which is interleaved;
a demodulator which demodulates the received stream;
an equalizer which equalizes the demodulated stream; and
a decoder which decodes the equalized stream,
wherein the received stream is constituted by the digital broadcast transmitting apparatus arranging plurality of streams according to a preset processing unit, in a manner that a stream of a single processing unit is disposed in at least one arrangement unit and a stream of a subsequent processing unit is disposed in a remaining area of the at least one arrangement unit, adding the RS parity to an end portion of the arranged plurality of streams in a direction perpendicular to an arrangement direction of the disposed stream, and adding the CRC value to the arranged plurality of streams in the arrangement direction of the disposed stream.

2. The digital broadcast receiving apparatus according to claim 1, wherein the received stream comprises a normal data stream and an additional data stream which is processed to be robust against an error compared to the normal data stream.

3. A method for processing a stream in a digital broadcast receiving apparatus, the method comprising:
receiving a stream;
demodulating the received stream;
equalizing the demodulated stream; and
deinterleaving the equalized stream,
wherein the stream is arranged at a transmitter by arranging more than one segment, which is a processing unit of the stream at the transmitter, in a single arrangement unit, adding Reed-Solomon (RS) parities in a direction of arranging the stream in the single arrangement unit, adding Cyclic Redundancy Check (CRC) values are in a direction perpendicular to the direction of adding the RS parities, and then interleaving the arranged stream.

4. The method according to claim 3, wherein the received stream comprises a normal data stream and an additional data stream which is processed to be robust against an error compared to the normal data stream.

5. The digital broadcast receiving apparatus of claim 1, wherein the tuner receives the stream in burst units one of which comprises a dummy.

6. The method of claim 3, wherein the receiving a stream comprises receiving the stream in burst units one of which comprises a dummy.

* * * * *